(12) United States Patent
Maillard et al.

(10) Patent No.: US 11,652,481 B2
(45) Date of Patent: May 16, 2023

(54) DESIGNING SINGLE EVENT UPSET LATCHES

(71) Applicant: XILINX, INC., San Jose, CA (US)

(72) Inventors: Pierre Maillard, Campbell, CA (US); Betty Lau, Fremont, CA (US); Yanran Chen, San Jose, CA (US); Jun Liu, San Jose, CA (US); Martin L. Voogel, Niwot, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/405,073

(22) Filed: Aug. 18, 2021

(65) Prior Publication Data
US 2023/0055458 A1  Feb. 23, 2023

(51) Int. Cl.
| | |
|---|---|
| *H03K 19/003* | (2006.01) |
| *G06F 30/392* | (2020.01) |
| *H03K 19/20* | (2006.01) |
| *H03K 3/0233* | (2006.01) |
| *G06F 30/30* | (2020.01) |

(52) U.S. Cl.
CPC .......... *H03K 19/003* (2013.01); *G06F 30/30* (2020.01); *G06F 30/392* (2020.01); *H03K 3/0233* (2013.01); *H03K 19/20* (2013.01)

(58) Field of Classification Search
CPC .... H03K 19/003; H03K 3/0233; H03K 19/20; G06F 30/30; G06F 30/392
USPC ......................................................... 716/110
See application file for complete search history.

(56) References Cited

U.S. PATENT DOCUMENTS

| | | | |
|---|---|---|---|
| 9,054,684 B1 | 6/2015 | Sood et al. | |
| 9,281,807 B1 | 3/2016 | Maillard et al. | |
| 10,263,623 B1 | 4/2019 | Chen et al. | |
| 10,574,214 B1 | 2/2020 | Maillard et al. | |
| 2012/0182048 A1* | 7/2012 | Eaton ............... | H03K 19/00338 326/122 |
| 2013/0162293 A1* | 6/2013 | Lilja ....................... | G06F 30/00 716/121 |
| 2013/0166990 A1* | 6/2013 | Morris ................ | G06F 11/0793 714/764 |
| 2018/0367143 A1* | 12/2018 | Maharrey ........ | H03K 19/00338 |

\* cited by examiner

*Primary Examiner* — Paul Dinh
(74) *Attorney, Agent, or Firm* — Patterson + Sheridan, LLP (57) ABSTRACT

One example of the present disclosure is an integrated circuit (IC). The IC includes an inverter with an input and an output, a clock transmission gate coupled to the output of the inverter; and a plurality of storage cells. The clock transmission gate is coupled to each of the plurality of storage cells, wherein each of the plurality of storage cells comprises a plurality of nodes arranged based on a minimum spacing.

19 Claims, 8 Drawing Sheets

DESIGNING SINGLE EVENT UPSET LATCHES

TECHNICAL FIELD

Examples of the present disclosure generally relate to latches and, in particular, to designing single-event upset latches.

BACKGROUND

Among circuit components, latches and flip-flops are used to enable edge-triggered storages in integrated circuits, such as application-specific integrated circuits (ASICs) and field programmable gate arrays (FPGAs). Latches and flip-flops are susceptible to single-event upsets (SEUs), which can cause data stored in latches and/or flip-flops to be corrupted.

SEU events are caused by cosmic rays, as well as radioactive impurities that may be embedded in integrated circuits and their packages. Cosmic rays and radioactive impurities generate high-energy atomic particles such as, for example, neutrons and alpha particles. Data storage elements generally include transistors and other components that are formed from a patterned silicon substrate. When an atomic particle strikes the silicon in the storage element, electron-hole pairs are generated. The electron-hole pairs create a conduction path that can cause a charged node in the storage element to discharge, and thus the state of the storage element to flip. If, for example, a "1" was stored in the storage element, an SEU event could cause the stored "1" to change to a "0", creating an error.

SEUs can lead to systematic errors and downtime. The failure rate associated with SEUs is commonly known as soft error rate (SER) and the industrial metric used to quantify the SER of the circuit is known as failure in-time (FIT) rate. Standard latch designs show a large sensitivity to SEU. To prevent the occurrence of SEU in latches (especially critical ones), dual interlock storage cell (DICE) SEU latches (e.g., Xilinx 26 poly-pitch (PP) SEU Latch) are designed to reduce the SER of the cells following energetic particles irradiation. However, the area penalty/overhead associated to such SEU latches is typically three to four times larger than a standard latch, as there is a significant distance between nodes to prevent SEU from corrupting nodal redundancy. Furthermore, as the count of latches is considerably increasing in Active on Active devices and next generation devices, the IC die would suffer a considerable area penalty while implementing the SEU solutions. Therefore, a more compact SEU latch design with similar SEU performance and substantially less area penalty is needed.

Similarly, conventional SEU-tolerant FF uses a cross-coupled inverter latch as its primary latch and the 26-PP SEU latch as the secondary latch. The same compact SEU latch design can be used in the secondary latch for the SEU-tolerant FF to achieve similar SEU performance and substantially less area penalty.

SUMMARY

Examples of the present disclosure generally relate to designing single event upset latches.

One example of the present disclosure is an integrated circuit (IC). The IC includes an inverter with an input and an output, a clock transmission gate coupled to the output of the inverter; and a plurality of storage cells. The clock transmission gate is coupled to each of the plurality of storage cells, wherein each of the plurality of storage cells comprises a plurality of nodes arranged based on a minimum spacing.

Another example of the present disclosure is a method for designing an IC layout. The method includes determining a redundancy scheme for cell radiation tolerance for a plurality of nodes of the integrated circuit layout. The method includes determining minimum spacing between the plurality of nodes for cell radiation tolerance. The method includes arranging the plurality of nodes for the IC layout based on the determined minimum spacing and based on the redundancy scheme.

Another example of the present disclosure includes an apparatus, comprising of at least one processor; and a memory coupled to the at least one processor. The memory includes code executable by the at least one processor to cause the apparatus to determine a redundancy scheme for cell radiation tolerance for a plurality of nodes of the integrated circuit layout. The memory includes code executable by the at least one processor to cause the apparatus to determine minimum spacing between the plurality of node for cell radiation tolerance. The memory includes code executable by the at least one processor to cause the apparatus to arrange the plurality of nodes for the IC layout based on the determined minimum spacing and based on the redundancy scheme.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples described herein relate to integrated circuits with elements that are resistant to single event upset (SEU) events. In particular, examples herein describe a SEU latch circuit and techniques for designing the SEU latch circuit. The techniques for designing the SEU latch circuit involve optimizing the spacing between nodes of a SEU latch circuit to minimize charge sharing. As described herein, a node is a connection in the circuit between two or more circuit elements. Some nodes may be depicted as coupled to only one circuit element, such as the input node and the output node. In some examples, the node may be a drain of a circuit element, and accordingly, examples herein describe optimizing the spacing between connected drains of an SEU latch circuit.

Examples herein also describe SEU latch circuit with no performance degradation as compared to the latch circuit without SEU protection. Further, the SEU latch circuit also saves about 73% in terms of the area compared to conventional SEU circuits. The SEU latch circuit as described herein improves the soft error rate (SER) because of optimized spacing between nodes.

Figure 1A:
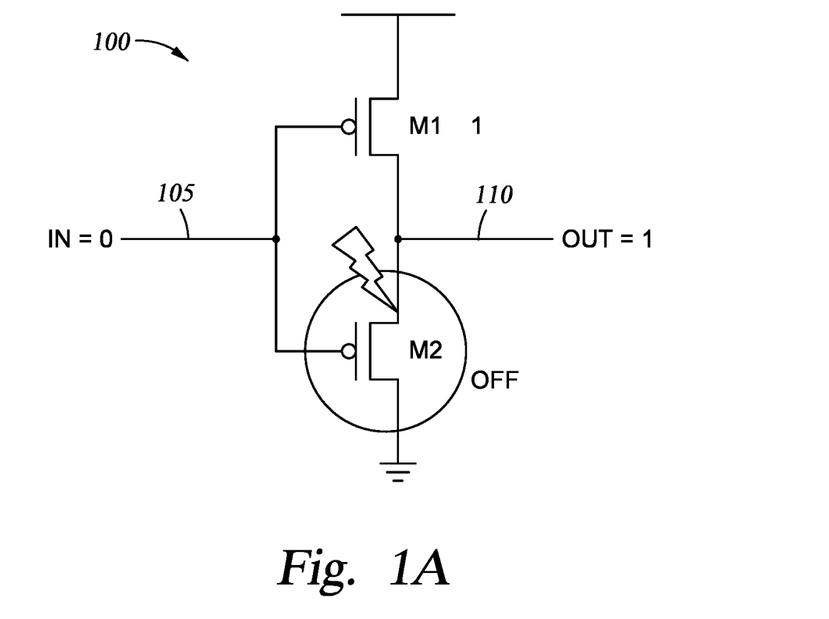
FIGS. 1A and 1B depict an example circuit and an example single event upset (SEU).
Figure 1B:
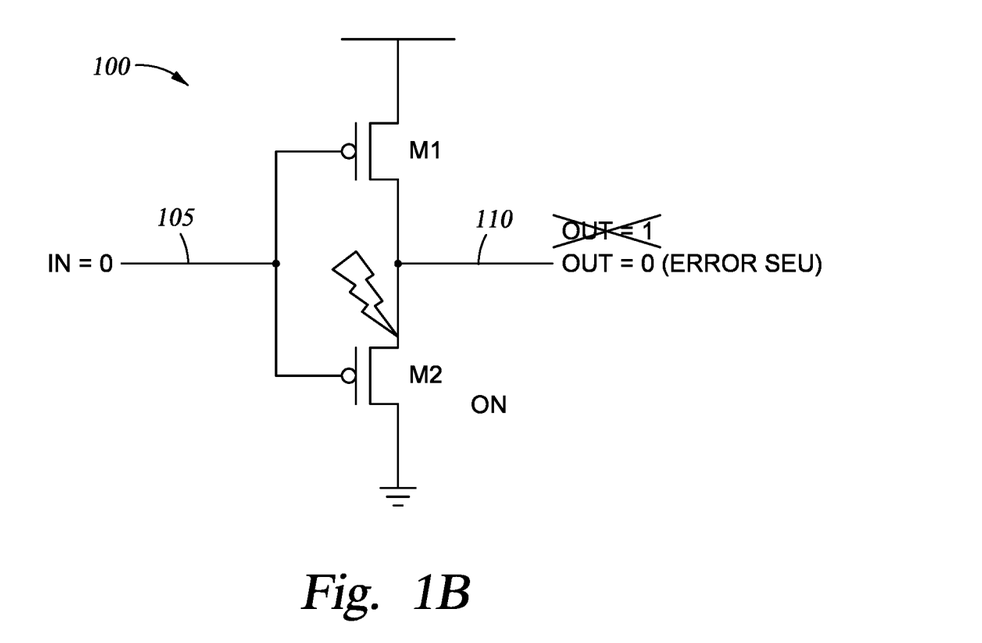

FIGS. 1A and 1B depicts an example circuit and an example single event upset (SEU). With reference thereto, FIGS. 1A and 1B illustrates a circuit 100 with a transistor M1 and a transistor M2. The transistor M1 is coupled to an input 105, to a source voltage, to an output 110, and to the transistor M2. The transistor M2 is coupled to the input 105, to the transistor M1, to the output 110, and to ground voltage. Without any single event upsets, when the input 105 is 0, the output 110 of the circuit is 1. However, as illustrated in FIG. 1B, a single particle strike at transistor M2 may cause an error at the output 110 and cause the output 110 to change from 1 to 0, resulting in an SEU.

The example latch structure of FIGS. 1A and 1B is vulnerable to SEU events. Upon the occurrence of a single particle strike, the storage data on the storage elements' internal nodes or its output nodes can change, and thus generate a soft error (e.g. an SEU). The structure is vulnerable to such bit flips if a SEU generated charge is high enough. Accordingly, the minimum value of a charge required to upset a given node is known as the "critical charge".

When redundancy is incorporated in the circuit design process, one way to achieve desired SEU tolerance is to space the nodes far from each other so that a single particle strike doesn't disturb all of the redundant copies, therefore leaving the output of the circuit intact. However, if this SEU protection can be achieved without a significant increase in the size of the latch-such as would be the case if a DICE latch was implemented-then increased reliability in return for a relatively low on-chip "real estate" cost may be achieved.

Figure 2:
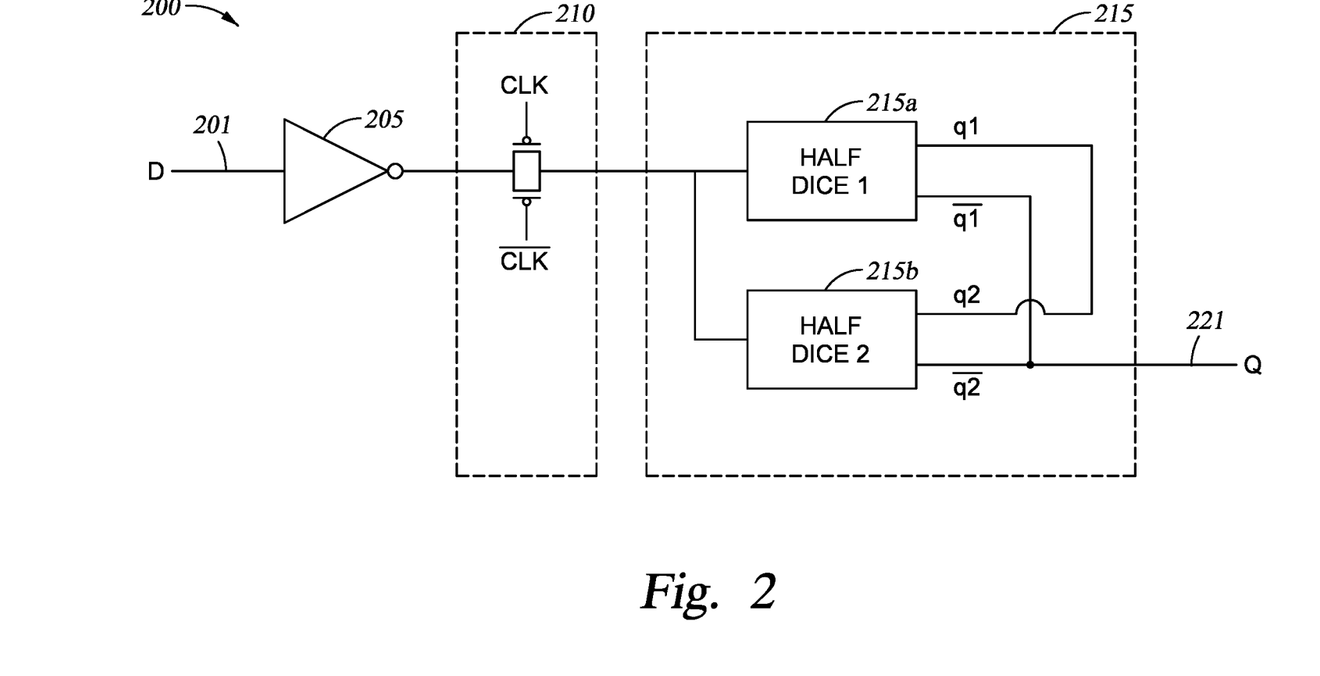
FIG. 2 is a diagram of a SEU latch circuit, according to some examples.

FIG. 2 is a schematic diagram of a SEU latch circuit, according to some examples. The SEU latch circuit 200 includes an input 201, an inverter 205, a clock transmission gate 210 (also known as a flop sampling gate), which is clocked by a CLK signal. The SEU latch circuit 200 includes two dual interlock storage cells (DICE) 215a and 215b (collectively referred to as DICE 215), and the clock transmission gate 210 is coupled to both DICE 215a and 215b. The DICE 215a and 215b are two copies of the same storage element for producing the same latch output Q 221 (the same as q1 and q2), as well as the same inverted latch output $\overline{q1}$ and $\overline{q2}$. In some examples, the two DICE 215a and 215b can be implemented as half DICE circuit elements. Generally, when a single particle hits and disturbs the voltage of one of the internal nodes of the DICE, one of the data storage nodes out of q1, q2, $\overline{q1}$, and $\overline{q2}$ might be disturbed temporarily. However, since the q1 and q2 (as well as $\overline{q1}$ and $\overline{q2}$) are tightly coupled, $\overline{q1}$ and q1 (as well as $\overline{q2}$ and q2) also reinforce each other. Disturbing only one data storage node will not change the stored data, hence achieving SEU resiliency.

With reference thereto, the SEU latch circuit 200 receives an input signal 201 at the input node, and the input signal 201 passes through the inverter 205. The inverted input signal then goes to a transmission gate 210 (also known as a flop sampling gate), which, as shown, is clocked by a clock (CLK) signal. The clock signal enables the inverted input signal to pass through the transmission gate 210. Thus when the clock signal is low, the transmission gate 210 is open for data sampling, and passes the inverted input signal, and when the clock is high, the gate is closed, and the data that was sampled in the immediately prior clock cycle is stored in the latch. The transmission gate 210 may be formed out of, for example, two connected transistors, one P-channel metal oxide semiconductor (PMOS) and the other N-channel metal oxide semiconductor (NMOS).

Once the inverted input signal passes through the clock transmission gate 210, the inverted input signal then goes to both DICEs 215a and 215b. The DICE 215 prevents unintended changes in the memory. In some examples, the DICE 215a and 215b are a part of a DICE circuit. A DICE circuit having a first half DICE 215a and a second half DICE 215b is shown in FIG. 2. The transmission gate 210 passes the inverted input signal to a first half DICE 215a to generate the q1 and $\overline{q1}$ signals. Similarly, the transmission gate 210 passes the inverted input signal to a second half DICE 215b to generate the q2 and $\overline{q2}$ signals, which are outputted as Q at the output node. While DICE cells are shown by way of example, other SEU-protected latches could be implemented.

The SEU latch circuit 200 of FIG. 2 produces outputs according the following table:

| CLK1 | CLK2 | D (input signal 201) | Q (output signal 221) |
|---|---|---|---|
| 0 | 1 | 0 | Q |
| 0 | 1 | 1 | Q |
| 1 | 0 | 0 | Qsaved |
| 1 | 0 | 1 | Qsaved |

Figure 3:
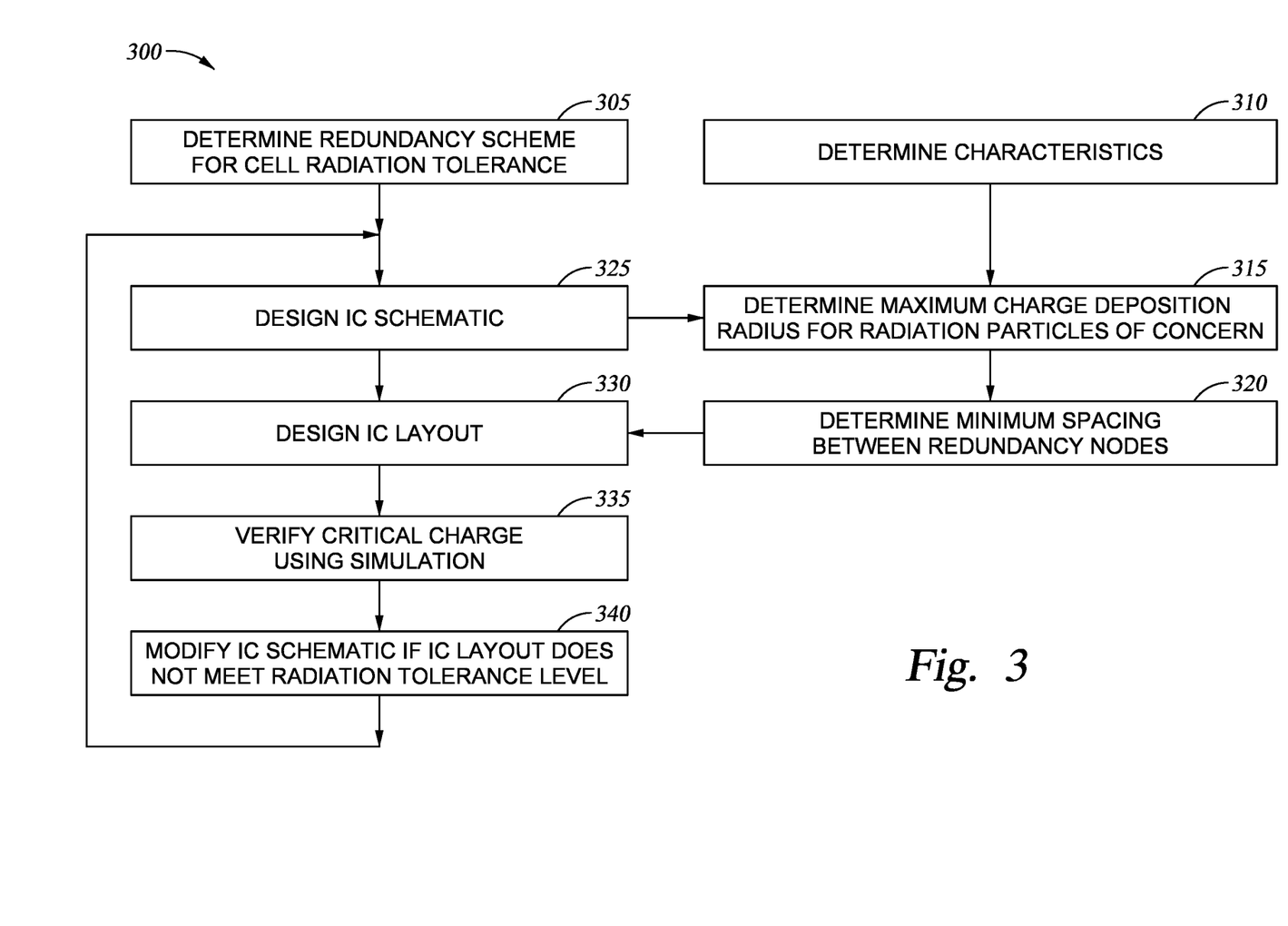
FIG. 3 is a flow diagram for a method for designing an SEU latch circuit.

FIG. 3 is a flow diagram for a method 300 for designing an SEU latch circuit. Portions of the method 300 may be performed by a computer, or may be implemented as software components that are executed on one or more processors. In some examples, the method can design an SEU latch circuit disposed on stacked die devices, each of the dies of these stacked die devices having active circuitry. The method 300 can design the SEU latch circuit 200 as illustrated in FIG. 2.

At block 305, the method 300 involves determining a redundancy scheme for cell radiation tolerance. Determining which redundancy scheme involves using certain circuit components for the SEU latch circuit for cell radiation tolerance. For example, the method 300 can determine to use DICE components (such as the half DICE 215a and the half DICE 215b) or other SEU-protection components (e.g., SEU-protected flip-flops) for the SEU latch circuit.

At block 325, the method 300 continues with a computer or a user designing the IC schematic (such as the IC schematic of FIG. 2) once the redundancy scheme for cell radiation tolerance has been determined. Designing the IC schematic based on the redundancy scheme can involve removing or adding circuit components to the IC to tradeoff between performance, power efficiency and SEU protection of the IC.

At block 310, the method 300 involves a computer or a user determining characterization of components to be used with the IC. In some examples, IC component characterization includes silicon technology characterization through custom silicon test chips and radiation experiment. Such characterization determines characteristics of the components that may be used with the IC because IC components manufactured by different manufacturers may have different characteristics (e.g., maximum current, width, length, maximum performance frequency) despite being manufactured for the same purpose or same function. Accordingly, determining characterization of components is needed so that certain components are chosen for use with the IC. In some examples, determining the IC component characterization can occur simultaneously as or prior to determining the redundancy scheme and designing the IC schematic.

At block 315, the method 300 continues with the computer or the user determining the maximum charge deposition radius for radiation particles of concern, after determining IC component characterization. In some examples, the IC components can be selected based on the IC component characteristics for use with the IC schematic, and accordingly, when determining the maximum charge deposition radius. In some examples, determining the maximum deposition radius includes placing the known IC components, which are susceptible to SEUs, at known (x,y) coordinates in a 2-D array on silicon test chips. The method determines the maximum deposition radius by recording the maximum number of adjacent IC component SEUs in both x and y dimensions.

At block 320, the method 300 continues with the computer or the user determining minimum spacing between nodes after determining the maximum charge deposition radius for the radiation particles of concern, to ensure that single particle strike will not disturb multiple redundant nodes (for example q1 and q2 in FIG. 2) at the same time. In some examples, the method determines minimum spacing between nodes of the components of the IC layout to minimize charge sharing between the nodes by using the determined maximum charge deposition for each node of each IC component of the IC layout. Determining the minimum spacing between nodes can involve iteratively going through the nodes of the components of the IC layout to minimize spacing between the nodes to the value of maximum charge deposition radius.

At block 330, the method 300 continues with the computer or the user designing the IC layout, including the SEU latch circuit. In some examples, designing the IC layouts involves receiving the determined minimum spacing between nodes of each component of the IC schematic and receiving the IC schematic. With the minimum spacing between nodes of each component of the IC schematic, the nodes in the IC components in an IC layout can be placed according to the minimum spacing relative to each other. An example of an IC layout is depicted in FIG. 4.

At block 335, the method 300 continues with the computer verifying the critical charge of each node of the IC layout using simulation. In some examples, verifying the critical charge using simulation can involve simulating single particle strikes at each node of each of the components of the IC schematic and layout. Verifying the critical charge can also involve examining the residual SEFI failure in-time (FIT) rate of the IC layout during simulation.

At block 340, the method 300 continues with the computer or the user modifying the IC schematic if the IC layout does not meet radiation tolerance levels. In some examples, the components of the IC layout does not meet radiation tolerance levels based on the SEU simulations. Like with designing the IC schematic, modifying the IC schematic can involve adding or removing IC components to the IC schematic designed earlier, such as adding or removing clock transmission gates in order to add or remove redundancy from the IC schematic. Once the computer or user completes modifying the IC schematic, the computer continues with designing the IC layout in accordance with the modified IC schematic with the minimum spacing corresponding the components of the modified IC schematic.

Figure 4:
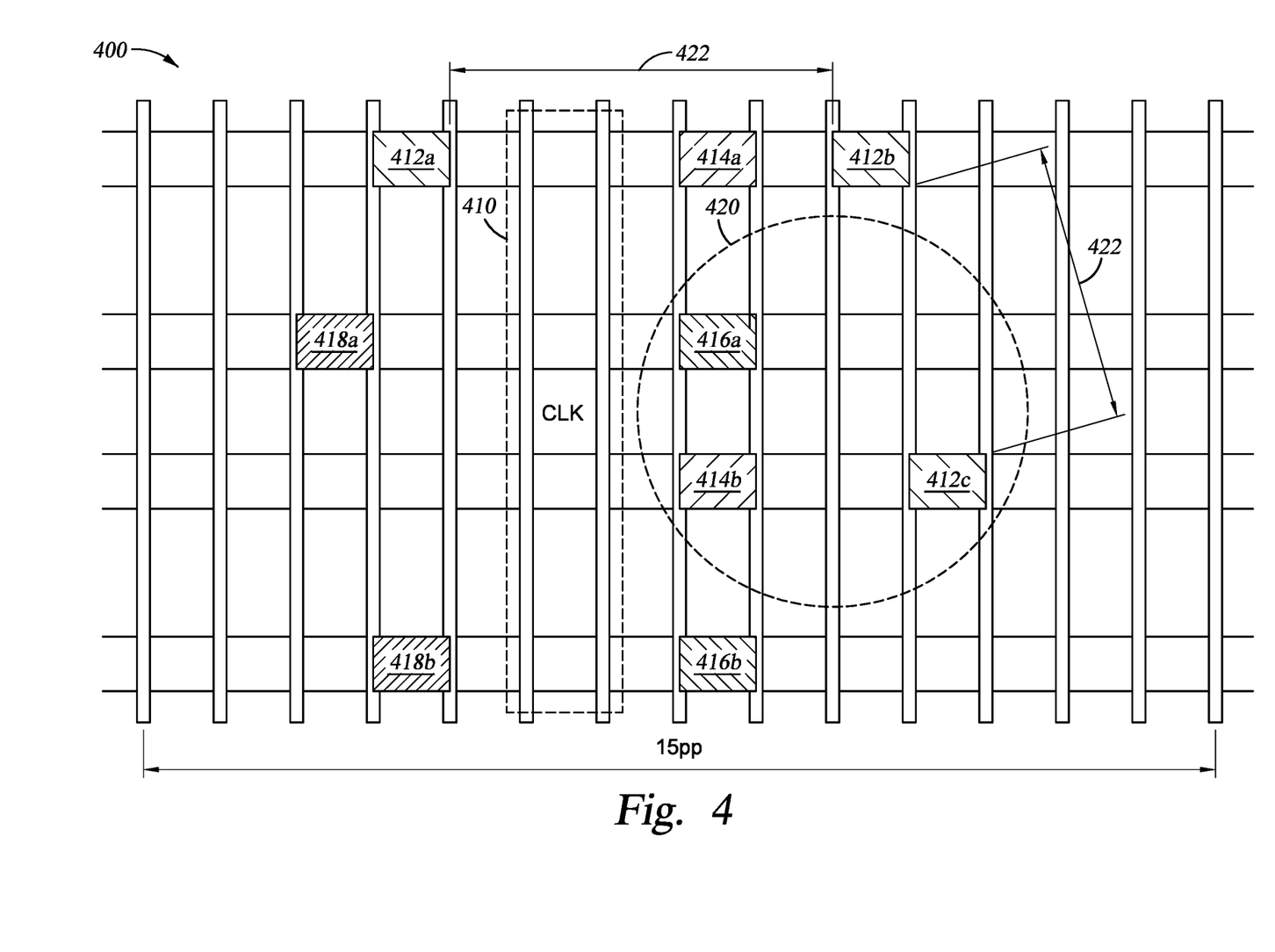
FIG. 4 illustrates an example IC layout including an example SEU latch circuit.

FIG. 4 illustrates an example IC layout including an example SEU latch circuit 400.

Generally, an SEU latch is much more SEU resilient than a standard latch circuit due to the implemented circuit component redundancy. For example, in some cases, a SEU latch can be more than 100 times more SEU-resilient than the standard latch circuit. Some SEU latches include two half DICE latches with two separate clock transmission gates for redundancy purposes, with one of the clock transmission gates connected to one of the half DICE latches and to the other clock transmission gate. SEU latches can include significant distance between nodes to prevent SEU from corrupting nodal redundancy. Some SEU latches are sized at 26 poly-pitch (pp) and are thus three times larger in size than a conventional standard latch sized at 9 pp.

According to some examples, the SEU latch 400 can be sized at 15 pp and can be 50 to 100 times more resilient to SEU than a standard latch with 60% area overhead. In such examples, the nodes of the SEU latch 400 are spaced on beam data analysis.

As illustrated in FIG. 4, the SEU latch 400 includes a clock transmission gate 410 corresponding the clock transmission gate 210 of FIG. 2 and DICE elements corresponding to the DICE elements 215 of FIG. 2. The IC layout further includes nodes for DICE elements: node 412a, node 412b, node 412c, node 414a, node 414b, node 416a, node 416b, node 418a, and node 418b. The node 412a, node 412b, and node 412c each are coupled to the output for DICE 215a and provide the signal q1. In such examples, the node 414a and node 414b each are coupled to the output for DICE 215b and provide the signal q2. The node 416a and node 416b each are coupled to the output for DICE 215a and provide the signal $\overline{q1}$. The node 418a and the node 418b each are coupled to the output for DICE 215b and provides the signal $\overline{q2}$.

The nodes of the DICE elements of the IC layout are spaced apart by distance 422 such that each of the nodes are outside of any other node's maximum charge deposition. For example, the circle 420 indicates a maximum charge deposition for node 412c, and the maximum charge deposition circle 420 does not reach nodes 412a and 412b, which are the other nodes from the same IC component as node 412c. While the maximum charge deposition circle 420 for node 412c does reach node 416a, any charge sharing between node 412c and node 416a would not cause an SEU event because disturbing only one data storage node of a DICE element does not change the stored data in the DICE element. Instead, the charge sharing needs to occur between all coupled nodes for the DICE element to experience an SEU event.

Accordingly, determining the maximum charge deposition for nodes of the SEU-protected circuit components can optimize placement of nodes in an IC layout, and optimizing placement of nodes in an IC layout can prevent SEU events while minimizing the overall area required by the IC.

Figure 5:
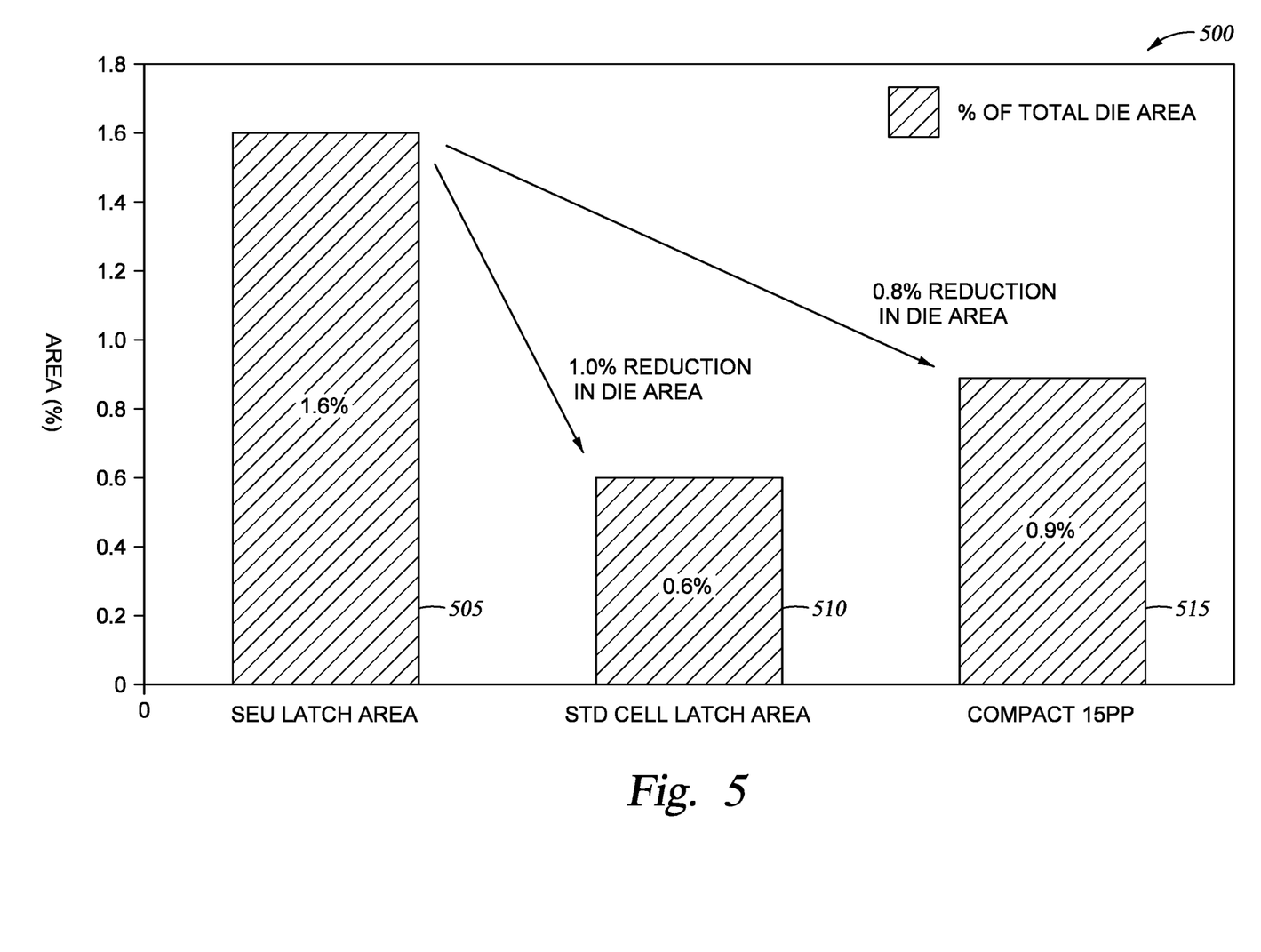
FIG. 5 is a graph illustrating the area increase for multiple latch circuits, according to some examples.

FIG. 5 is a graph illustrating the area comparison for multiple latch circuits, in some application examples. The graph 500 illustrates an estimated area cost comparison for three different circuits: area for a standard latch circuit 510, area for a conventional SEU latch 505, and area for the SEU latch 515 as illustrated in FIG. 2. As referred hereto, the standard latch circuit, the convention SEU latch circuit, and the SEU latch can be disposed on a die, and each circuit is disposed on a certain amount of area of the die. As illustrated in the graph of FIG. 5, the SEU latch can result in a total die area reduction of 0.8% comparing with the convention SEU latch circuit, which is only 0.2% lower than the total die area reduction of using the standard latch circuit.

Figure 6:
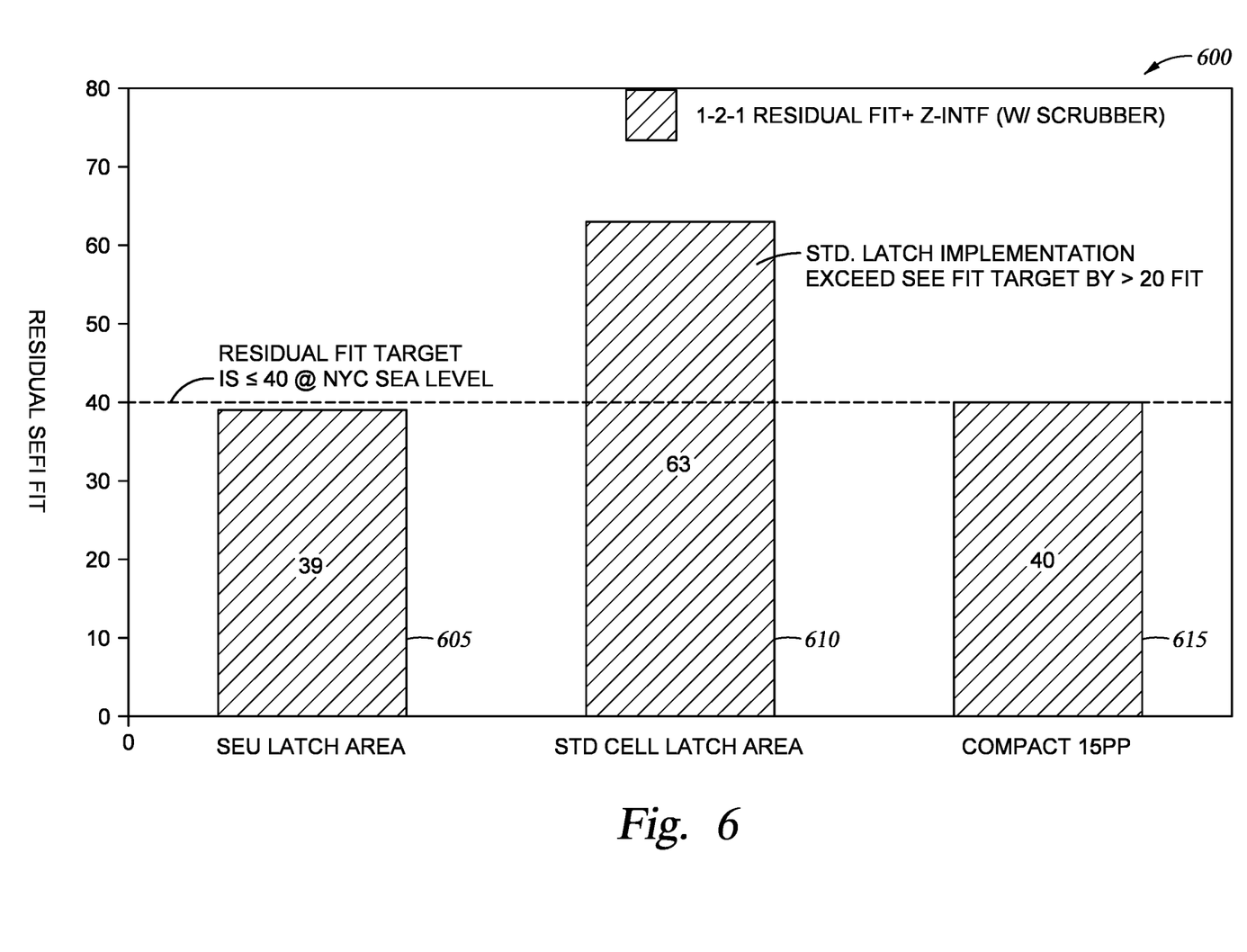
FIG. 6 is a graph depicting residual single event failure interrupt (SEFI) FIT for multiple latch circuits, according to some examples.
Figure 7A:
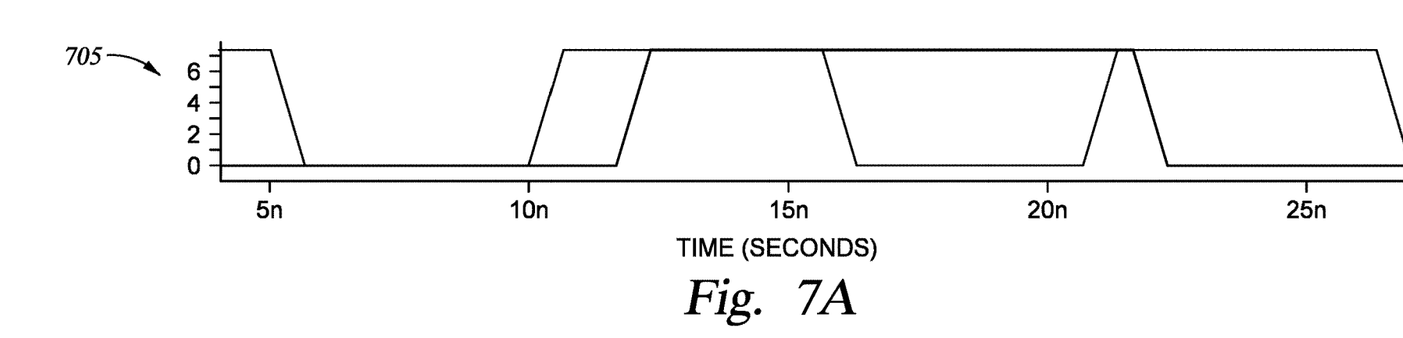
FIGS. 7A, 7B, 7C, 7D, and 7E illustrate circuit simulation results for multiple latch circuits, according to some examples.
Figure 7B:
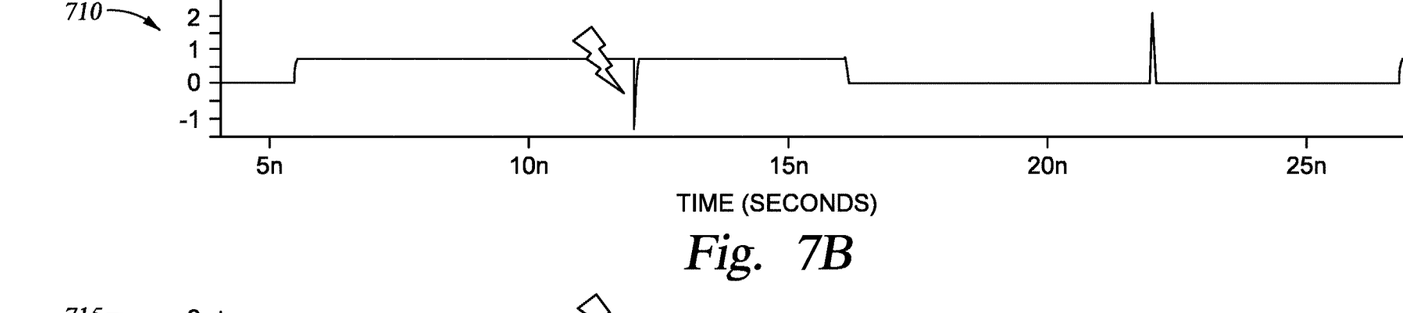
Figure 7C:
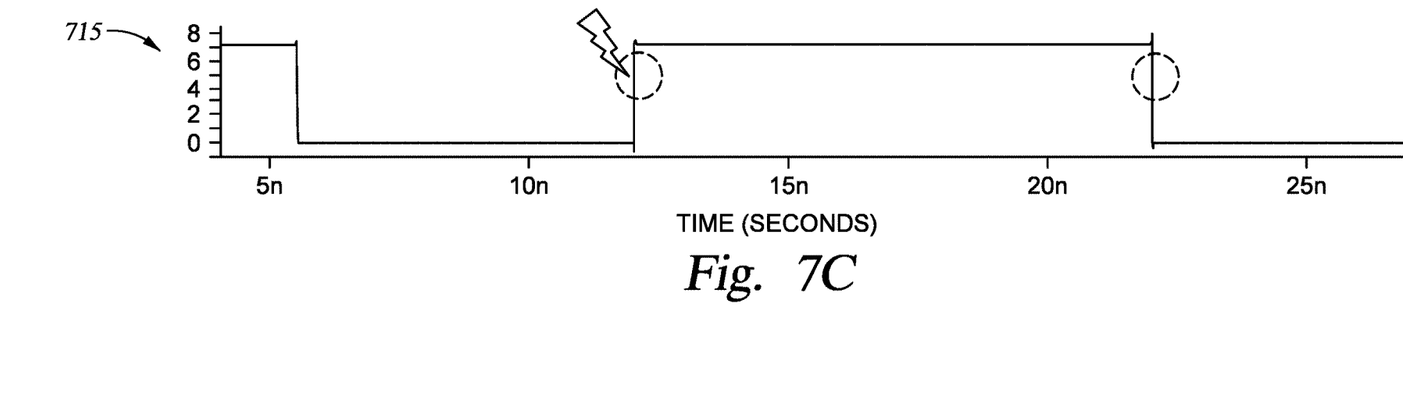
Figure 7D:
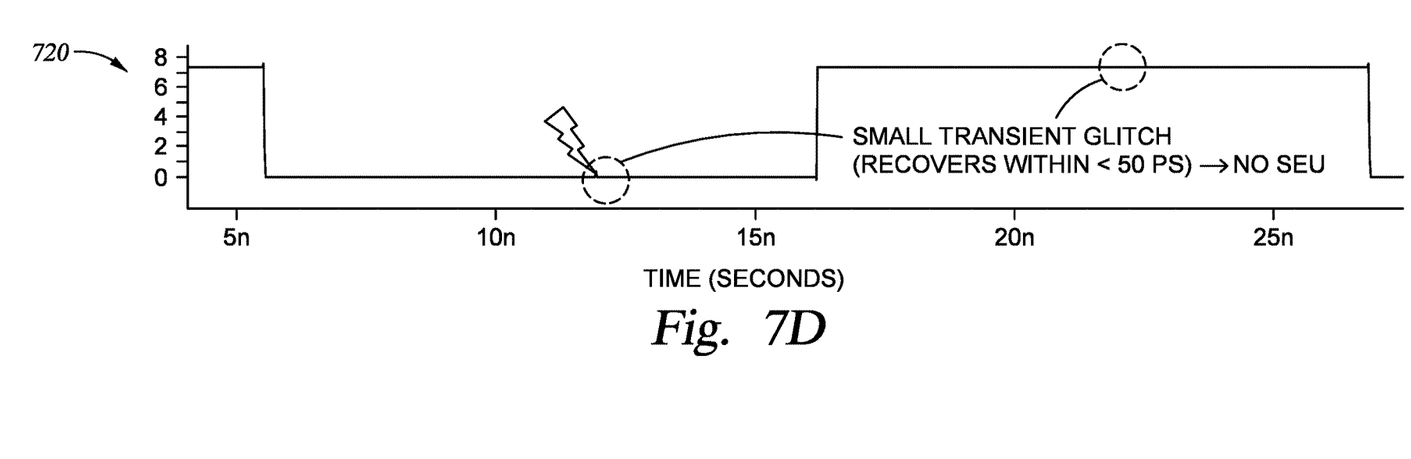
Figure 7E:
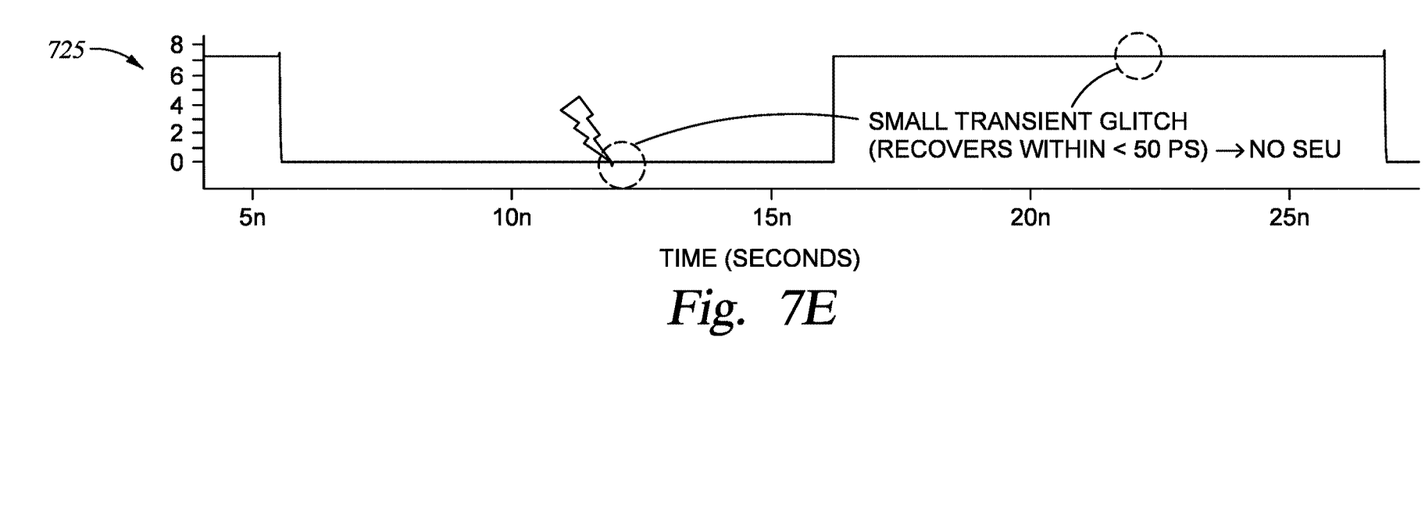

FIG. 6 is a graph depicting residual SEFI FIT for multiple latch circuits, according to some examples. The graph 600 illustrates residual SEFI FIT at sea level at New York City, N.Y., United States for three different circuits: the residual SEFI FIT for a standard latch circuit 610, the residual FIT for a conventional SEU latch circuit 605, and the residual SEFI FIT for the SEU latch circuit 615. For the particular example, the residual SEFI FIT target is equal to or less than 40 at sea level at New York City level. As illustrated in FIG. 6, the residual FIT of the conventional SEU latch circuit 605 and of the SEU latch 615 both meet the residual SEFI FIT target, showing that they are of similar SEU robustness. However, the residual SEFI FIT of the standard latch circuit 610 exceeds the targeted residual SEFI FIT by more than 20 FIT, which translates into a 58% increase in system downtime.

FIGS. 7A, 7B, 7C, 7D, and 7E show the circuit SPICE simulation results for the impact of an SEU event on the output of a standard latch circuit 715, a conventional SEU latch circuit 720 and the disclosed SEU latch circuit 725. Voltage responses in 705 illustrates the input conditions, including the CLK and the input Data signals, to the three different circuits. Simulated internal voltage spike caused by single particle strike is presented in 710.

As illustrated, when the internal node of the standard latch circuit experienced the voltage spike 710, the output of the standard latch circuit 715 flipped (from '0' to '1') accordingly, resulted in an SEU.

Because DICE implementation in conventional SEU latch circuit, when the internal node of the conventional SEU latch circuit experienced the voltage spike 710, the output of the conventional SEU latch circuit 720 has a small transient glitch that recovers within less than 50 ps.

Similarly, when the internal node of the disclosed SEU latch circuit experienced the voltage spike 710, the voltage performance of the conventional SEU latch circuit 725 has a small transient glitch that recovers within less than 50 ps.

As mentioned previously, the SEU latch design reduces the area overhead associated to the SEU latch by 73%, while maintaining similar SEU resilience in stacked multi-die devices with active circuitry. The SEU latch circuit described herein can be 50 to 100 times more resilient to SEU than standard latches. The SEU latch circuit relies on minimizing the spacing between nodes to minimize charge sharing, based on beam data analysis. In some examples, the SEU latch circuit incorporates 2 half DICE latches with a common clock transmission gate to further reduce the cell's area overhead. The common clock transmission gate can result in a 60% area overhead for the SEU latch design as compared to conventional latches and conventional SEU latches. Implemented in the Z-intf block only, the SEU latch design can save about 1% of die area while meeting all SEE Architecture FIT requirement while maintaining the performance of the SEU cell. In some cases, the SEU latch design improves performance by 2% as compared to conventional SEU latch circuits.

The methods disclosed herein comprise one or more steps or actions for achieving the methods. The method steps and/or actions may be interchanged with one another. In other words, unless a specific order of steps or actions is specified, the order and/or use of specific steps and/or actions may be modified.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The various operations of methods described above may be performed by any suitable means capable of performing the corresponding functions. The means may include various hardware and/or software component(s) and/or module(s), including, but not limited to a circuit, a digital signal processor (DSP), an application specific integrated circuit (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media includes both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein, for example, instructions for performing the operations described herein and illustrated in FIG. 3.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. An integrated circuit (IC), comprising:
   an inverter with an input and an output;
   a clock transmission gate coupled to the output of the inverter; and
   a plurality of storage cells, wherein the clock transmission gate is coupled to each of the plurality of storage cells, wherein each of the plurality of storage cells comprises a plurality of nodes, each of the plurality of nodes is spaced apart from other nodes of the plurality of nodes based on a minimum spacing, the minimum spacing for each node of the plurality of nodes being greater than a maximum charge deposition radius of each adjacent node of the plurality of nodes.

2. The integrated circuit of claim 1, wherein each of the plurality of storage cells is a dual-interlocked storage cell.

3. The integrated circuit of claim 1, wherein the clock transmission gate comprises a clock input pair with a first transistor and a second transistor, the clock input pair coupled to a clock signal and an inverted clock signal.

4. The integrated circuit of claim 1, wherein the minimum spacing between each of the plurality of nodes is based on beam data analysis.

5. The integrated circuit of claim 1, wherein the minimum spacing between each of the plurality of nodes is configured to minimize charge sharing.

6. The integrated circuit of claim 1, wherein each output of each of the plurality of storage cells is coupled to an output of another of the plurality of the storage cells.

7. The integrated circuit of claim 1, wherein the maximum charge deposition radius for each of the plurality of nodes is based on a determination of characterization of each of the plurality of nodes of each of the plurality of storage cells.

8. A method for designing an integrated circuit (IC) layout, comprising:
   determining a redundancy scheme for cell radiation tolerance for an IC layout, wherein the integrated circuit (IC) layout comprises a first IC component having a plurality of nodes;

determining minimum spacing between the plurality of nodes for cell radiation tolerance based on a maximum charge deposition radius for the plurality of nodes, the minimum spacing for each node of the plurality of nodes being greater than the maximum charge deposition radius of each adjacent node of the plurality of nodes; and arranging the plurality of nodes of the first IC component for the IC layout based on the determined minimum spacing and based on the redundancy scheme.

9. The method of claim 8, further comprising verifying critical charge of the plurality of nodes.

10. The method of claim 9, further comprising modifying the IC layout if the arrangement of the plurality of nodes fails to meet radiation tolerance levels during verification of critical charge.

11. The method of claim 8, further comprising determining node characteristics for each of the plurality of nodes of the first IC component.

12. The method of claim 8, further comprising:
determining the maximum charge disposition radius for each of the plurality of nodes based on beam data analysis.

13. The method of claim 8, wherein the plurality of nodes include nodes for a first dual-interlocked storage cell and nodes for a second dual-interlocked storage cell.

14. The method of claim 13, wherein the IC layout includes nodes for a clock transmission gate coupled to the nodes for the first dual-interlocked storage cell and the nodes for the second dual-interlocked storage cell.

15. The method of claim 8, wherein the plurality of nodes include nodes for a clock transmission gate.

16. An apparatus, comprising:
at least one processor; and
a memory coupled to the at least one processor, the memory comprising code executable by the at least one processor to cause the apparatus to:
determine a redundancy scheme for cell radiation tolerance for an integrated (IC) layout, wherein the IC layout comprises a first IC component having a plurality of nodes;
determine minimum spacing between the plurality of nodes for cell radiation tolerance based on a maximum charge deposition radius for the plurality of nodes, the minimum spacing for each node of the plurality of nodes being greater than the maximum charge deposition radius of each adjacent node of the plurality of nodes; and
arrange the plurality of nodes of the first IC component for the IC layout based on the determined minimum spacing and based on the redundancy scheme.

17. The apparatus of claim 16, wherein the memory further comprises code executable by the at least one processor to cause the apparatus to verify critical charge of the plurality of nodes.

18. The apparatus of claim 17, wherein the memory further comprises code executable by the at least one processor to cause the apparatus to modify the IC layout if the arrangement of the plurality of nodes fails to meet radiation tolerance levels during verification of critical charge.

19. The apparatus of claim 16, wherein the memory further comprises code executable by the at least one processor to cause the apparatus to determine node characterization for each of the plurality of nodes.

* * * * *